United States Patent
Mitchell et al.

(10) Patent No.: US 6,690,083 B1
(45) Date of Patent: Feb. 10, 2004

(54) USE OF SILICIDE BLOCKING LAYER TO CREATE HIGH VALUED RESISTOR AND DIODE FOR SUB-1V BANDGAP

(75) Inventors: Todd Mitchell, San Antonio, TX (US); Mark W. Haley, Rio Medina, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/586,411

(22) Filed: Jun. 1, 2000

(51) Int. Cl.$^7$ .............................................. H01L 29/00
(52) U.S. Cl. ...................... 257/538; 257/536; 257/537; 257/516; 257/518
(58) Field of Search ................................. 257/510, 516, 257/518, 536, 537, 538

(56) References Cited

U.S. PATENT DOCUMENTS

| | | | | |
|---|---|---|---|---|
| 5,882,967 A | * | 3/1999 | Brown et al. ............... | 458/237 |
| 5,998,848 A | * | 12/1999 | Brown et al. ............... | 257/407 |
| 6,015,993 A | * | 1/2000 | Voldman et al. ............. | 257/355 |
| 6,232,163 B1 | * | 5/2001 | Voldman et al. ............. | 438/212 |
| 6,277,723 B1 | * | 8/2001 | Shih et al. .................. | 438/597 |

* cited by examiner

Primary Examiner—Jerome Jackson
Assistant Examiner—Joseph Nguyen
(74) Attorney, Agent, or Firm—Peter Zawilski

(57) ABSTRACT

The present invention is drawn to a method and a system for creating a sub-1V bandgap reference (BGR) circuit. In particular, a sub-1V BGR circuit is formed comprising a shallow trench isolation (STI) region and a poly silicon region above said STI region. The poly silicon region is formed having a first doped region longer than a second doped region. The poly silicon region as one single structure is adapted to function as a resistor and a diode coupled in series, said structure adapted to generate currents in a feedback loop to generate a BGR voltage. In forming the sub-1V BGR circuit, a silicide blocking mask (already available in the process flow for forming a standard semiconductor device) is used to prevent spacer oxide from forming above the center portion of the poly silicon region. In turn, silicide contacts can be formed away from the center portion of the poly silicon region.

7 Claims, 12 Drawing Sheets

USE OF SILICIDE BLOCKING LAYER TO CREATE HIGH VALUED RESISTOR AND DIODE FOR SUB-1V BANDGAP

FIELD OF THE INVENTION

The present invention relates to a bandgap reference (BGR) circuit. In particular, the present invention relates to a sub-1 V BGR circuit.

BACKGROUND

In a prior art sub-1V BGR circuit, elements such as op-amps, diodes, and resistors are implemented. These elements are fabricated as individual separate structures that work together as the sub-1V BGR circuit. Each element of the sub-1 V BGR circuit, as an individual structure, needs to be separated somewhat from the other elements of the sub-1V BGR. As such, the area occupied by the sub-1V BGR circuit cannot be accounted for merely by the elements themselves, but must additionally be accounted for by the extra spaces separating these elements.

Referring now to FIG. 1, a side sectional view of a resistor-diode series 110 implemented in a prior art sub-1V BGR circuit 100 is shown. Sub-1V BGR circuit 100 includes two portions 120 and 140. Portion 120 includes a resistor 121, while portion 140 includes a diode 141. Together, portions 120 and 140 include resistor-diode series 110 that is a part of sub-1V BGR circuit 100.

Referring still to FIG. 1, Resistor 121 and diode 141 as shown are individual and separate structures. As an individual structure, resistor 121 needs to be separated somewhat from diode 141. As such, the area occupied by sub-1V BGR circuit 100 cannot be accounted for merely by resistor 121 and diode 141 themselves, but must additionally be accounted for by the space between resistor 121 and diode 141.

Problematically, in typical applications (e.g., in an embedded system or in a system on-a-chip design), available chip real estate becomes so precious that the sub-1V BGR circuit occupies more area than desired. Furthermore, the resistance of the prior art sub-1V BGR circuit is difficult to control. To improve control of the resistance using conventional approaches, the standard process flow needs to be severely modified, thereby decreasing throughput in the fabrication process.

Thus, a need exists for a sub-1V BGR circuit that does not occupy as much space as the prior art sub-1V BGR. Additionally, a need exists for a sub-1V BGR that provides better control of the resistance for the resistor included therein. Further still, a need exists for a sub-1V BGR that is manufacturable using the process flow typically used in forming a standard semiconductor device, while not perturbing the process flow.

SUMMARY OF THE INVENTION

The present provides a sub-1V BGR circuit that does not occupy as much real estate as the prior art sub-1V BGR. Additionally, the present invention provides better control of the resistance for the resistor within the sub-1V BGR. Further still, the present invention provides a sub-1V BGR that is manufacturable using the process flow typically used in forming a semiconductor device, while not perturbing the process flow. As an additional benefit not available in the prior art sub-1V BGR circuit, the present invention provides a sub-1V BGR circuit without requiring complex structures.

Specifically, rather than having separate structures, the present invention provides a sub-1V BGR circuit as a single structure. The resistance of a resistor within this sub-1V BGR circuit is easier to control as compared to the resistance of a resistor within a conventional sub-1V BGR circuit. Also, the present invention provides a sub-1V BGR circuit that, in one embodiment, consumes approximately 14× less real estate than is consumed by a conventional sub-1V BGR circuit.

In one embodiment of the present invention, the sub-1V BGR circuit comprises a shallow trench isolation (STI) region and a poly silicon region above said STI region. The poly silicon region as one single structure is adapted to function as a resistor and a diode coupled in series. Specifically, the structure is adapted to generate current in a feedback loop to provide a BGR voltage.

These and other objects and advantages of the present invention will no doubt become obvious to those of ordinary skill in the art after having read the following detailed description of the preferred embodiments which are illustrated in the various drawing figures.

BRIEF DESCRIPTION OF THE FIGURES

The accompanying drawings, which are incorporated in and form a part of this specification, illustrate embodiments of the present invention and together with the description, serve to explain the principles of the invention.

Prior Art

DETAILED DESCRIPTION OF THE INVENTION

Figure 1:
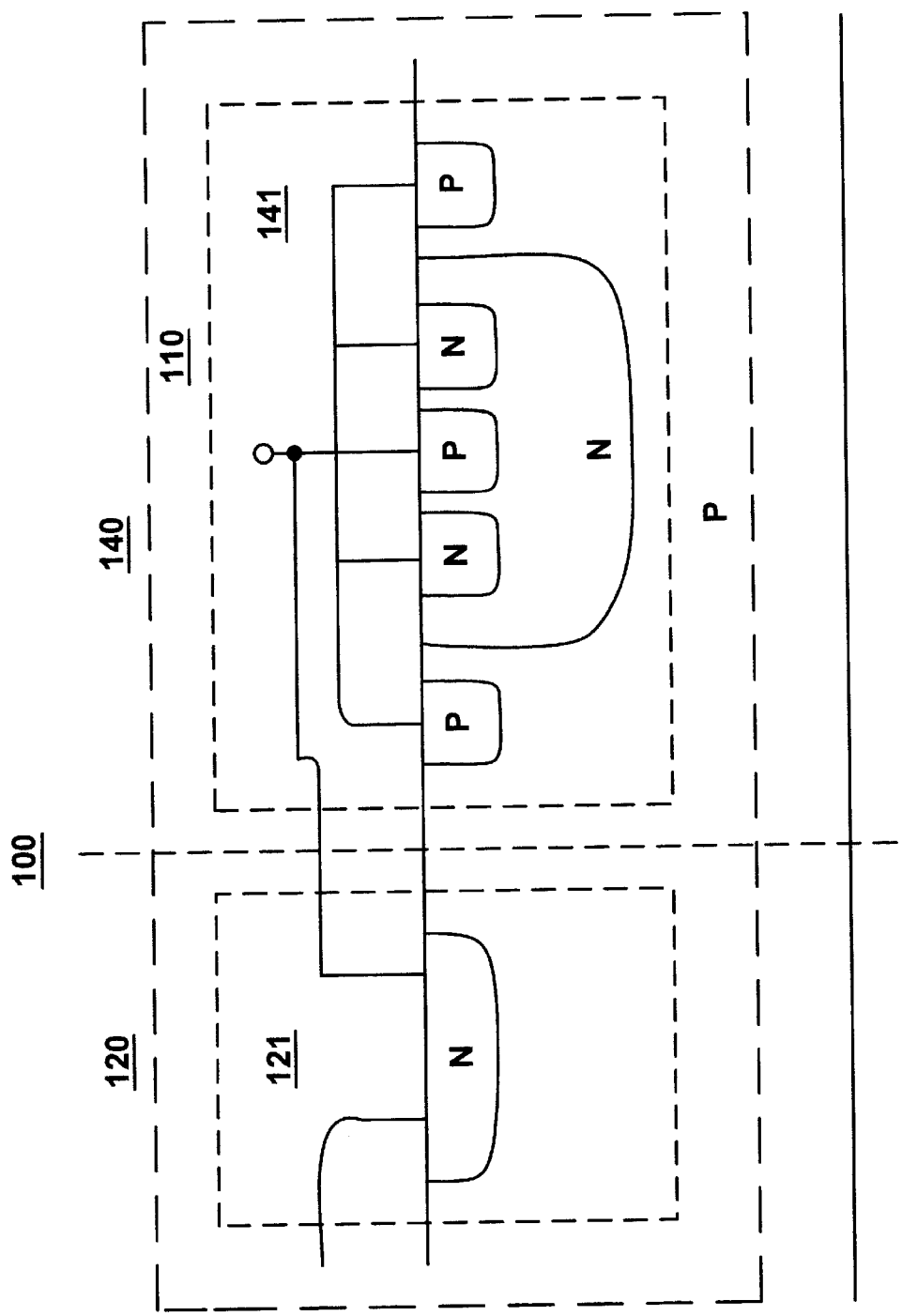
FIG. 1 depicts the side sectional view of a sub-1V bandgap reference (BGR) circuit according to a prior art approach.

Reference will now be made in detail to the preferred embodiments of the invention, a method for forming and an apparatus of a sub-1V BGR circuit, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

FIGS. 2A to 2H depict side sectional views of one embodiment of the present invention in progressive stages of forming a sub-1V BGR circuit. Because these stages can also be used without perturbation to the process flow for creating a standard semiconductor device such as a transistor, the formation of the transistor is shown concurrently in the same progressive stages.

However, as understood herein, the sub-1V BGR circuit does not need to be formed concurrently with a standard semiconductor device such as the transistor shown. The illustrated concurrent formations of the sub-1V BGR circuit and the transistor are meant to highlight one advantageous feature of the present invention. That is, the sub-1V BGR circuit can be formed using the standard process flow of forming a standard semiconductor device, while not requiring process steps foreign to the standard process flow.

Also, as will be described, in contrast to the prior art approach, the present embodiment does not use a resistor and a diode as two separate structures to form the sub-1V BGR circuit. Rather, the present embodiment fabricates a resistor and a diode as one single structure to form the sub-1V BGR circuit. More specifically, the resistor and the diode are arranged in series and fabricated as one single structure. Thus, as an additional benefit not available in the prior art sub-1V BGR circuit, the present invention provides a sub-1V BGR circuit without being complicated in structure.

Advantageously, although not necessary, the shallow trench isolation (STI) region and the poly silicon region that make up the resistor-diode series can be formed concurrently with the existing process flow for fabricating a standard semiconductor device such as a transistor. For this reason, each of FIGS. 2A to 2H depicts concurrent formation of a standard semiconductor device (e.g., a transistor) side by side with the illustrated formation of the sub-1V BGR circuit (comprising the resistor-diode series). The concurrent formations to be shown highlight the fact that forming the sub-1V BGR circuit does not perturb the standard process for forming a standard semiconductor device.

Figure 2A:
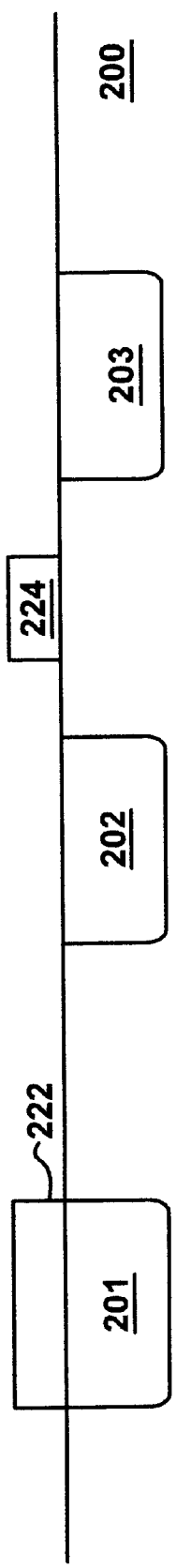
FIG. 2A depicts the side sectional view of one fabrication phase of forming a sub-1V BGR circuit concurrently with the formation of a semiconductor device in accordance with one embodiment of the present invention.

Referring now to FIG. 2A, a side sectional view of one embodiment of the present invention is depicted. Three STI regions 201–203 are formed within semiconductor substrate 200 that can be, for example, silicon. STI regions 201–203 are typically filled with an oxide using high density plasma deposition process.

Referring still to FIG. 2A, in the present embodiment, the present resistor-diode series will be formed above STI region 201. STI regions 202–203 are typically used to isolate neighboring electrical devices. A poly silicon region 222, which will become a part of a resistor-diode series for a sub-1V BGR circuit, is formed above STI region 201. The formation of poly silicon region 222 is adapted to be formed concurrently with the same process flow that is used to form poly silicon region 224, which will become a part of a standard semiconductor transistor. Specifically, poly silicon region 224 will be used as a gate of the standard semiconductor transistor.

In FIG. 2A, the concurrent formations of poly silicon regions 222 and 224 are shown to highlight the fact that the same process flow can be used without perturbation to the process flow. Thus, as understood herein, poly silicon regions 222 and 224 need not be formed concurrently.

Figure 2B:
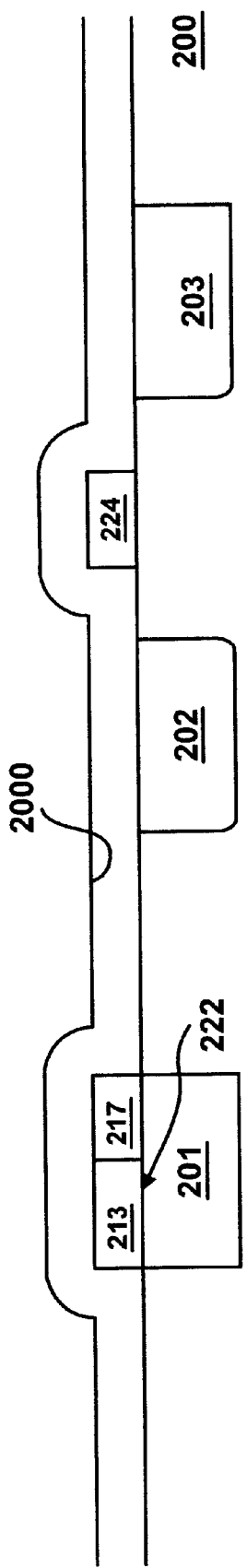
FIG. 2B depicts the side sectional view of another fabrication phase of forming the sub-1V BGR circuit concurrently with the formation of the semiconductor device in accordance with the embodiment in FIG. 2A.

Referring now to FIG. 2B, a conformal layer of oxide 2000 (e.g. silicon dioxide is deposited over the structure of FIG. 2A. Also, by this stage in the fabrication process, poly silicon region 222 includes a first doped region shown as a n-doped region 213, and a second doped region shown as a p-doped region 217. As such, poly silicon region 222 is adapted to be used as a resistor-diode series. Specifically, n-doped region 213 is not formed equal in length to p-doped region 217. Rather, as shown, n-doped region 213 is longer than p-doped region 217 such that the resistor-diode series is constituted by poly silicon region 222. The resistor of the resistor-diode series is constituted by n-doped region 213; the diode of the resistor-diode series is constituted by n-doped region 213 and p-doped region 217.

However, as understood herein, the first and second doped regions need not be doped, respectively, with n-type and p-type dopants. For example, in an alternative embodiment, the first and second doped regions are doped, respectively, with p-type and n-type dopants. More generally, the first and second doped regions are doped, respectively, with dopants of a first conductivity type and a second conductivity type.

Referring still to FIG. 2B, oxide material 2000 is deposited adjacent the ends of poly silicon region 222 and above poly silicon region 222 to cover both n-doped region 213 and p-doped region 217. Concurrently, oxide material is deposited adjacent ends of poly silicon region 224 that will become a part of the transistor. Also, oxide material 2000 is deposited above poly silicon region 224. The concurrent deposition of oxide material 2000 (adjacent to and above poly silicon region 222 and adjacent to and above poly silicon region 224) is shown to highlight the fact that this deposition occurs without perturbation to a standard device formation process flow. However, the present invention is also well suited to an embodiment in which the oxide material is not concurrently deposited adjacent to and above poly silicon region 222 and adjacent to and above poly silicon region 224.

Figure 2C:
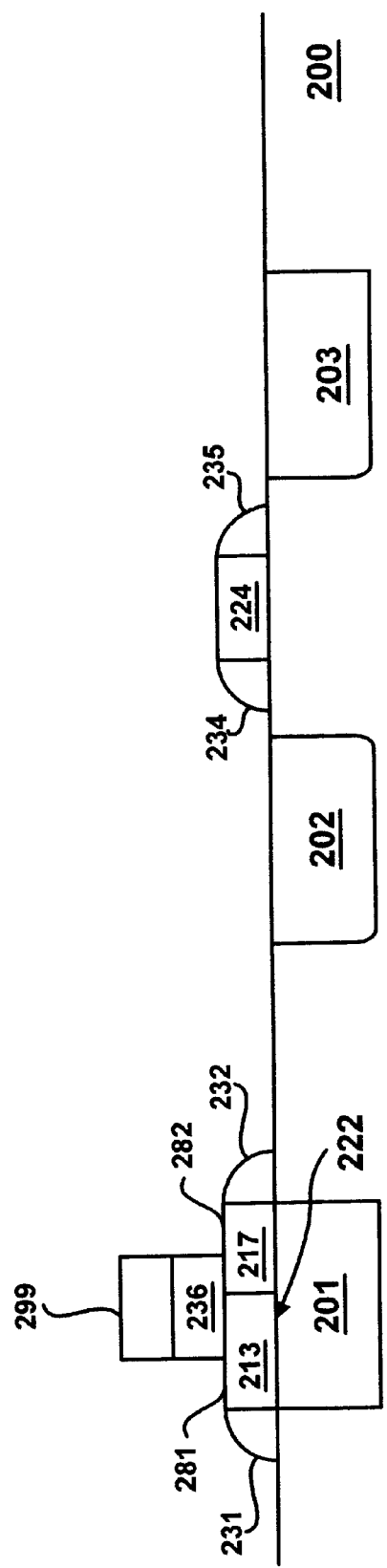
FIG. 2C depicts the side sectional view of another fabrication phase of forming the sub-1V BGR circuit concurrently with the formation of the semiconductor device in accordance with the embodiment in FIG. 2A.

Referring now to FIG. 2C, a silicide blocking layer 299 is formed above oxide material 2000 of FIG. 2B, and an oxide removal process is performed. In the present embodiment, silicide blocking layer 299 is made of photo resist film.

However, as understood herein, silicide blocking layer 299 may be made of other material which will prevent the removal of oxide material residing thereunder. After the oxide removal process, select portions of oxide material 2000 remain. Specifically, spacer oxide regions 231, 232, 234, and 235 remain. Additionally, region 236 of oxide material remains disposed above poly silicon region 222. Also, as understood herein, the deposition of silicide blocking layer 299 does not require perturbation to the process flow used to form a standard semiconductor device.

Referring still to FIG. 2C, contact surfaces 281–282 of poly silicon region 222 are exposed after the above-described oxide removal process. As understood herein, the etching/removal of portions of oxide material 200 does not require perturbation to the process flow used to form a standard semiconductor device.

Figure 2D:
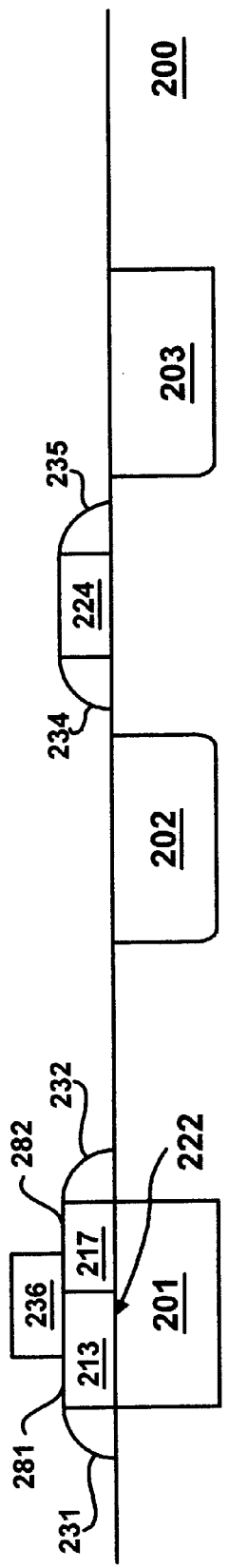
FIG. 2D depicts the side sectional view of another fabrication phase of forming the sub-1V BGR circuit concurrently with the formation of the semiconductor device in accordance with the embodiment in FIG. 2A.

Referring now to FIG. 2D, silicide blocking layer 299 is removed to expose spacer oxide region 236. As understood herein, the removal of silicide blocking layer 299 does not require perturbation to the process flow used to form a standard semiconductor device.

Figure 2E:
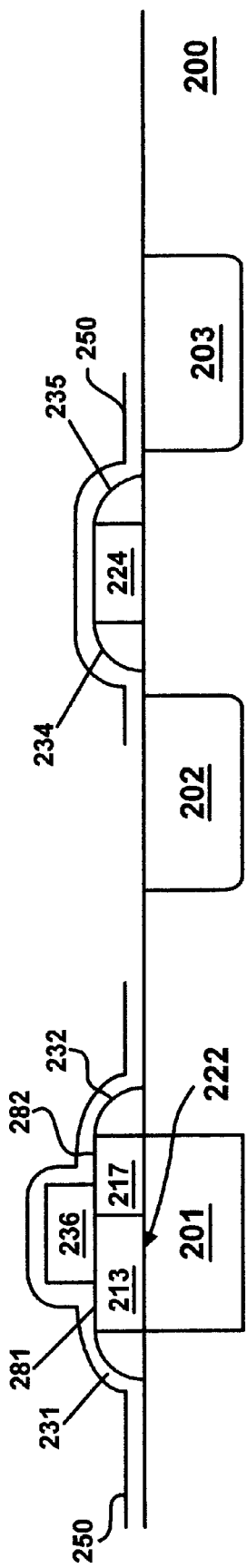
FIG. 2E depicts the side sectional view of another fabrication phase of forming the sub-1V BGR circuit concurrently with the formation of the semiconductor device in accordance with the embodiment in FIG. 2A.

Referring now to FIG. 2E, a titanium layer 250 is deposited. Although the present embodiment specifically recites the use of titanium to form layer 250, the present invention is also well suited to the use of various other titanium alloy materials, or to the use of various titanium layers with capping to form layer 250. As for poly silicon region 222, titanium layer 250 covers substrate 200, spacer oxide regions 231–232 and 236, and contact surfaces 281–282. Concurrently, as for poly silicon region 224, as a part of the standard semiconductor transistor, titanium layer 250 covers spacer oxide regions 234–235 and poly silicon region 224. The concurrent depositions of titanium layer 250 above poly silicon regions 222 and 224 are shown to highlight the fact that these two depositions use the same process flow without perturbation to the process flow. Thus, as understood herein, titanium layer 250 need not be deposited concurrently for both poly silicon regions 222 and 224. Specifically, even in the absence of a semiconductor device, titanium layer 250 can still be deposited above silicon region 222 for forming a sub-1V BGR circuit.

Figure 2F:
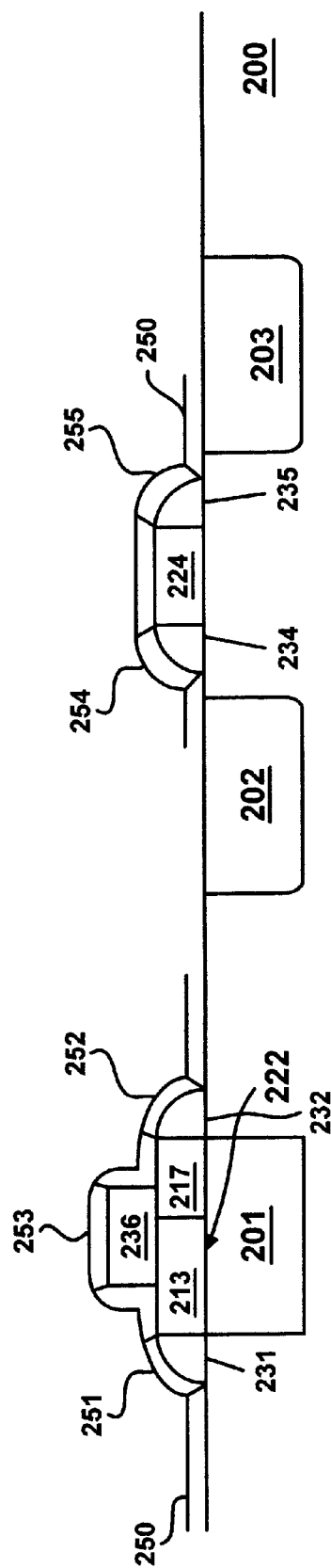
FIG. 2F depicts the side sectional view of another fabrication phase of forming the sub-1V BGR circuit concurrently with the formation of the semiconductor device in accordance with the embodiment in FIG. 2A.

Referring now to FIG. 2F, rapid thermal annealing (RTA) is applied to portions of titanium layer 250. The RTA causes the formation of silicide where portions of titanium layer 250 do not touch oxide. Specifically, the silicide formation occurs everywhere except regions 251, 252, 253, 254, and 255 where titanium layer 250 contacts, respectively, oxide regions 231 232, 236, 234, and 15 235. Silicide portions that are formed by the RTA process have low electrical resistance. As will be described in conjunction with the discussion of FIG. 2G, these silicide portions are to be used as electrical contacts for the sub-1V BGR circuit.

In FIG. 2F, the RTA process is applied to both poly silicon regions 222 and 224 to highlight the fact that forming the sub-1V BGR circuit in accordance with the present embodiment does not introduce processing steps foreign to the standard process flow for forming a standard semiconductor device such as the transistor being formed here. However, as understood herein, even without the transistor being formed here, RTA can still be applied for forming the sub-1V BGR circuit.

Figure 2G:
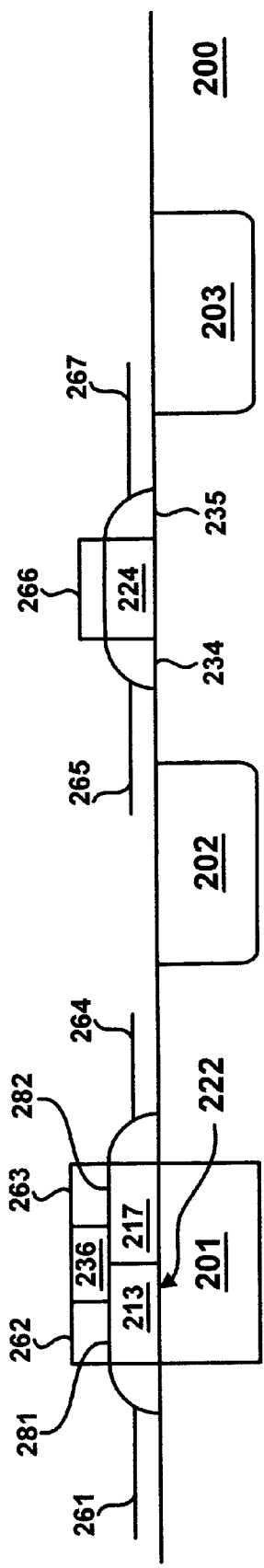
FIG. 2G depicts the side sectional view of another fabrication phase of forming the sub-1V BGR circuit concurrently with the formation of the semiconductor device in accordance with the embodiment in FIG. 2A.

Referring now to FIG. 2G, chemically unreacted portions 251–255 of titanium layer 250 are etched away, leaving only silicide portions 261–267 of titanium layer 250 as shown. As for the sub-1V BGR circuit being formed, silicide portion 262 resides above contact surface 281 to form the electrical contact for n-doped region 213, whereas silicide portion 263 resides above contact surface 283 to form the electrical contact for p-doped region 217. As for the semiconductor transistor being formed concurrently using the standard process flow, silicide portions 265–267 become, respectively, the electrical contacts for the drain, gate, and source of the semiconductor transistor.

In FIG. 2G, the concurrent etchings of titanium layer 250 above poly silicon regions 222 and 224 are shown to highlight the fact that these two etches use the same process flow without perturbation to the standard semiconductor device process flow. However, as understood herein, titanium layer 250 need not be etched concurrently from above both poly silicon regions 222 and 224. Specifically, even in the absence of the transistor being formed here, titanium layer 250 can still be etched from above silicon region 222 for forming a sub-1V BGR circuit.

Figure 2H:
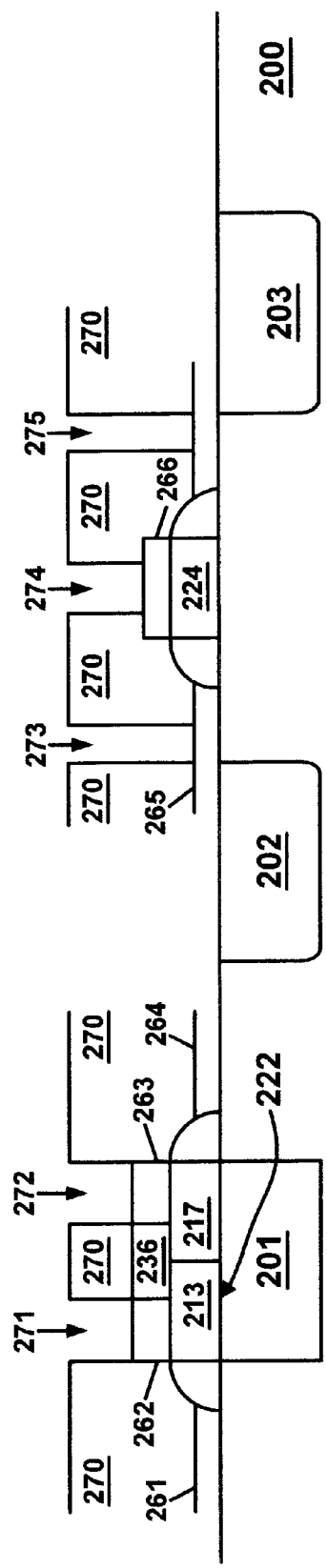
FIG. 2H depicts the side sectional view of another fabrication phase of forming the sub-1V BGR circuit concurrently with the formation of the semiconductor device in accordance with the embodiment in FIG. 2A.

Referring now to FIG. 2H, inter-metallic oxide (IMO) 270 is deposited as shown. Also as shown, concurrently with the formation of contact vias 273–275 within IMO 270, contact vias 271–272 have been formed within IMO 270. The concurrent formations of contact vias 271–272 (for the sub-1V BGR circuit) and 273–275 (for the transistor being formed) are shown to highlight the fact that these two depositions use the same process flow without perturbation to the aforementioned standard semiconductor device formation process flow. Thus, as understood herein, contact vias 271–272 for the sub-1V BGR circuit need not be formed concurrently with contact vias 273–275 for the transistor being formed. Specifically, even in the absence of the transistor being formed here, contact vias 271–272 can still be formed above silicon region 222 for forming the sub-1V BGR circuit.

Figure 2I:
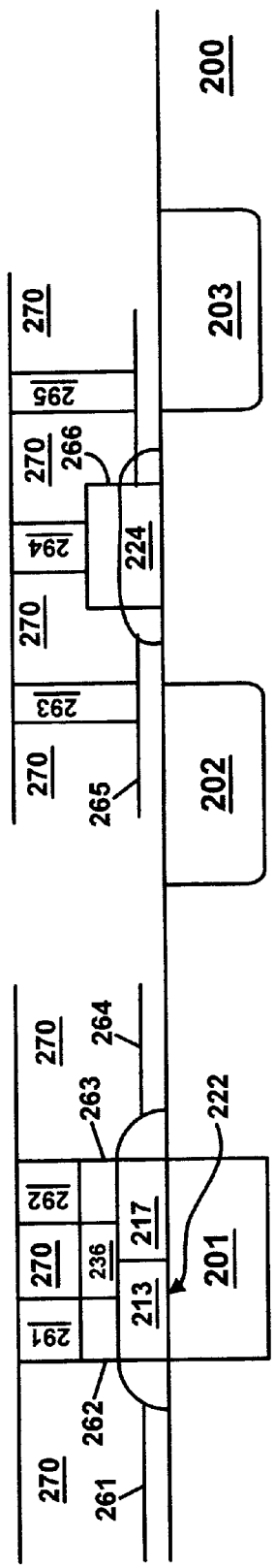
FIG. 2I depicts the side sectional view of another fabrication phase of forming the sub-1V BGR circuit concurrently with the formation of the semiconductor device in accordance with the embodiment in FIG. 2A.

Referring now to FIG. 2I, contact vias 271–275 are filled, respectively, with conducting plugs such as, for example, tungsten plugs 291–295. The present invention is, however, well suited to the use of various other conducting material to form plugs 291–295. Moreover, planarization such as, for example, chemical mechanical polishing (CMP) is performed so that the exposed surface of IMO 270 is level with the exposed ends of tungsten plugs 291–295. Thus, because the planarization is a part of the standard process flow for creating the standard semiconductor transistor, tungsten plugs 291–292 are put in place without perturbing the process flow of forming the semiconductor transistor (or any other standard semiconductor devices).

In FIG. 2I, planarization is applied for tungsten plugs 291–292 (for poly silicon regions 222) and 293–295 (for poly silicon region 224) to highlight the fact that forming the sub-1V BGR circuit in accordance with the present embodiment does not introduce processing steps foreign to the standard process flow for forming a standard semiconductor device such as the transistor being formed here. However, as understood herein, even without the transistor being formed here, planarization can still be applied for forming the sub-1V BGR circuit.

Figure 2J:
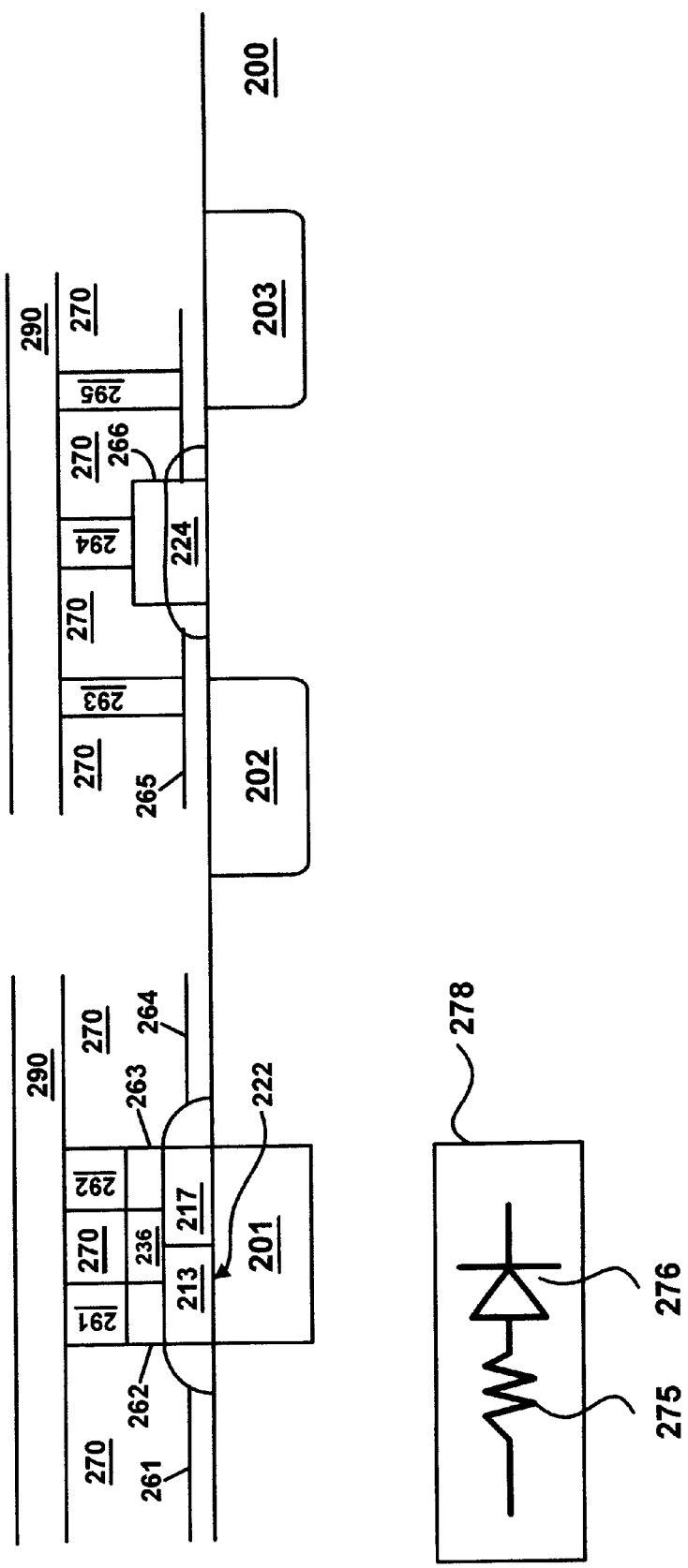
FIG. 2J depicts the side sectional view of another fabrication phase of forming the sub-1V BGR circuit concurrently with the formation of the semiconductor device in accordance with the embodiment in FIG. 2A.

Referring now to FIG. 2J, a metallic layer 290 is deposited above IMO 270. Specifically, metallic layer 290 connects electrically to poly silicon region 222 through both tungsten plugs 291–292 and silicide contacts 262–263. Also, metallic layer 290 connects electrically to the drain, gate, and source of the semiconductor transistor through, respectively, tungsten plugs 293–295. Thus, formation of the electric paths from metallic layer 290 to poly silicon region 222 does not perturb the existing standard process flow for forming the standard semiconductor transistor (or any other standard semiconductor device).

As understood herein, concurrent electric paths formations for both poly silicon regions 222 and 224 are shown to highlight the fact that forming the sub-1V BGR circuit in accordance with the present embodiment does not introduce processing steps foreign to the standard process flow for forming a standard semiconductor device such as the transistor being formed here. Even without the transistor being formed here, the electric paths from metallic layer 290 to poly silicon region 222 can still be formed using the same process flow.

Referring still to FIG. 2J, poly silicon region 222, with its electrical contacts to metallic layer 290 and with its position above STI region 201, functions as a sub-1V BGR circuit. Specifically, n-doped region 213 functions as a resistor 275 in the resistor-diode series (shown here schematically as resistor-diode series 278) of the sub-1V BGR circuit. Moreover, n-doped region 213 and p-doped region 217 together function as a diode 276 in the resistor-diode series (278) of the sub-1V BGR circuit. Resistor-diode series 278 is adapted for generating currents in a feedback loop to generate a BGR voltage.

Advantageously, in the process of forming poly silicon region 222 as a sub-1V BGR circuit, no perturbation is introduced to the standard process flow for forming the standard semiconductor transistor (or any other standard semiconductor devices). Additionally, when compared to the resistance of a resistor within the prior art sub-1V BGR circuit, the resistance of the resistor as constituted by n-doped region 213 is easier to control. Furthermore, as compared to the prior art sub-1V BGR circuit, the sub-1V BGR circuit is simple in structure. Advantageously, the sub-1V BGR circuit of the present embodiment is approximately 14× smaller than the prior art sub-1V BGR circuit.

Figure 3:
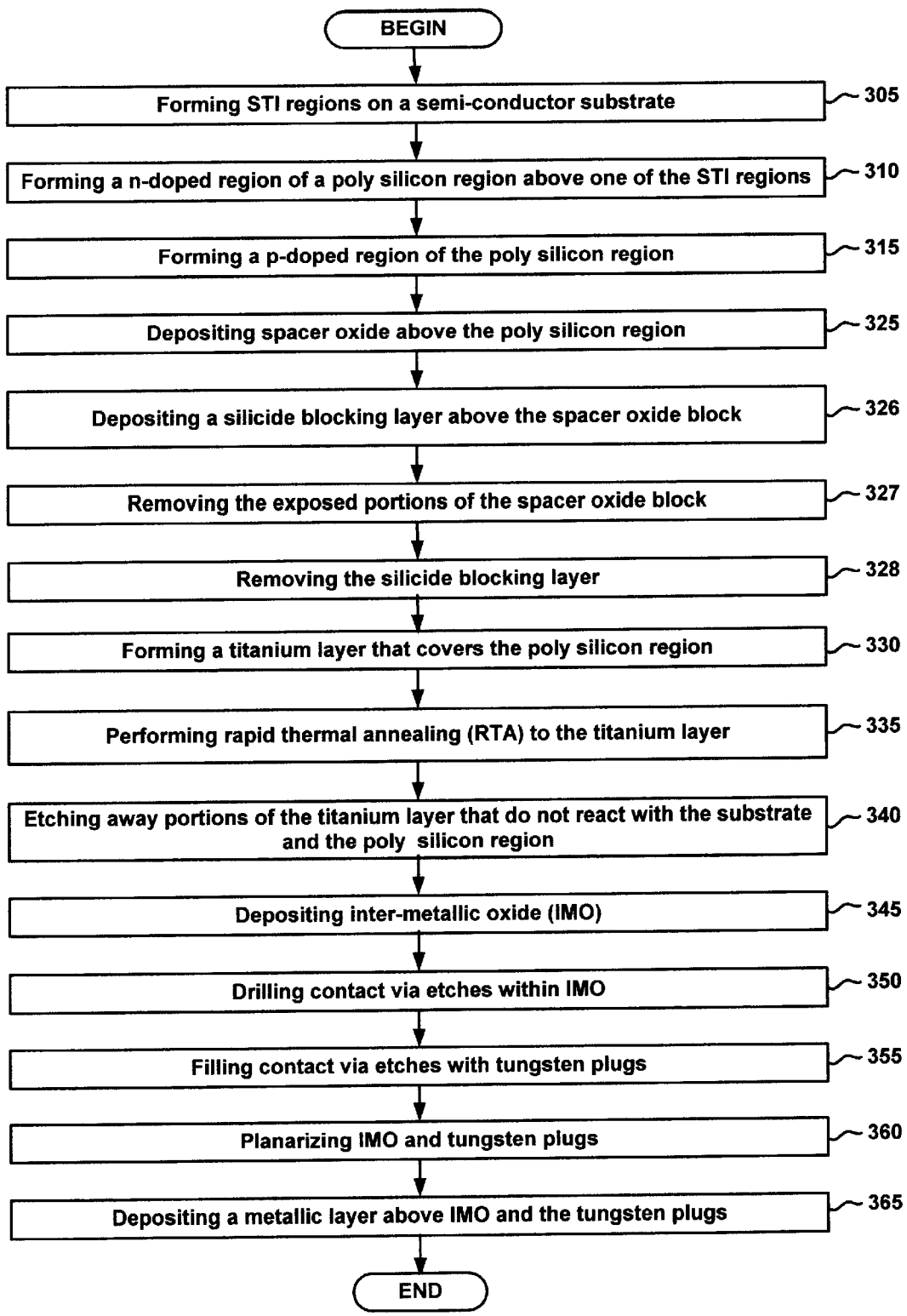
FIG. 3 is a flow chart outlining steps performed in accordance with one embodiment of the present invention.

FIG. 3 is a flow chart outlining steps performed in accordance with one embodiment of the present invention.

In step 305, STI regions are formed in a semiconductor substrate. Standard semiconductor device such as a transistor is typically fabricated in the region between two STI regions. Nevertheless, according to the present embodiment, a sub-1V BGR circuit will be using a poly silicon region formed above one of the STI regions.

In step 310, a n-doped region of the poly silicon region on the STI region is formed using the standard process flow typically used for creating a standard semiconductor device such as a transistor.

In step 315, a p-doped region of the poly silicon region is formed using the standard process flow. The p-doped region is formed such that the n-doped region is longer in length than the p-doped region. With its n-doped and p-doped regions wherein the n-doped region is longer than the p-doped region, the poly silicon region is adapted to be used as a resistor-diode series.

In step 325, a conformal layer of oxide material (e.g. silicon dioxide) is deposited above the structure formed in steps 305–315.

In step 326, a silicide blocking layer is deposited above selected portions of the layer of oxide material, to shield the selected portions from a subsequent oxide removal process (e.g. an oxide etch process).

In step 327, the exposed portions of the oxide material are removed, to leave a region of oxide above the poly silicon region. The region of oxide is centered above the center line of the poly silicon region. Furthermore, the region of oxide is small enough to leave exposed contact surfaces of the poly silicon region adjacent the ends of the poly silicon region.

In step 328, the silicide blocking layer is removed to expose the remaining region of oxide material, this remaining region is also referred to as a shortened spacer oxide block.

In step 330, a titanium layer is deposited using the standard process flow to cover the poly silicon region, its shortened spacer oxide block, and its side wall spacer regions.

In step 335, RTA of the standard process flow is performed to the titanium. Portions of the titanium undergo chemical reaction. Specifically, portions of the titanium layer that touch the semiconductor substrate and/or the poly silicon region undergo chemical reaction that causes the formation of silicide.

In step 340, portions of the titanium layer that do not react with the substrate or the poly silicon region (i.e., the non-silicided portion of the titanium layer) are etched away using the standard process flow. After the etching process, silicide contacts remain on ends of the poly silicon region.

In step 345, IMO is deposited above the poly silicon region using the standard process flow.

In step 350, using the standard process flow, contact via etches are formed in the IMO so that, thereafter, silicide contacts of the poly diode are exposed.

In step 355, contact via etches reaching the poly diode are filled with tungsten plugs using the standard process flow.

In step 360, IMO and tungsten plugs are planarized using the standard process flow. Typically, the planarization is implemented with CMP.

In step 365, using the standard process flow, a metallic layer is deposited above IMO and the tungsten plugs. In so doing, electrical conducting paths are formed from the metallic layer to the poly silicon region as a resistor-diode series. At this point, the poly silicon region can be used as a part of the sub-1V BGR circuit.

Referring still to the flow chart in FIG. 3, the steps implemented (in creating the poly silicon region as a part of the sub-1V BGR circuit) do not perturb the existing process flow for a standard semiconductor device (e.g., a transistor). As such, these steps can be implemented concurrently with the fabrication process flow for a standard semiconductor device (e.g., a transistor) such that no perturbation of the process flow is introduced. Thus, Advantageously, the existing process flow in forming a standard semiconductor device can also be used in creating a poly silicon region of the present invention as a part of a sub-1V BGR circuit. As an added benefit, the resistance of the resistor within the sub-1V BGR circuit of the present invention, unlike the resistance of the resistor in the prior art, is easier to control.

The foregoing descriptions of specific embodiments of the present invention have been presented for purposes of illustration and description. They are not intended to be exhaustive or to limit the invention to the precise forms disclosed, and obviously many modifications and variations are p possible in light of the above teaching. The embodiments were chosen and described in order to best explain the principles of the invention and its practical application, to thereby enable others skilled in the are to best utilize the invention and various embodiments with various modifications as are suited to the particular use contemplated. The scope of the invention is intended to be defined by the Claims appended hereto and their equivalents.

What is claimed is:

1. A sub-1V bandgap reference (BGR) circuit, comprising:
   a shallow trench isolation (STI) region; and
   a poly silicon region directly upon said STI region, wherein said poly silicon region, as one single structure, functions as a resistor and a diode coupled in series, and both terminals of the diode are vertically above the STI region, and exclusively in a horizontally oriented plane with respect to each other.

2. The sub-1V BGR circuit of claim 1, wherein said poly silicon region comprises a first doped region and a second doped region coupled together, said first region longer than said second doped region.

3. The sub-1V BGR curcuit of claim 2, wherein said first doped region adapted to constitute said resistor, and wherein said first and second doped regions together adapted to constitute said diode.

4. The sub-1V BGR circuit of claim 2, wherein said first doped region is a n-doped region, and wherein said second doped region is a p-doped region.

5. The sub-1V BGR circuit of claim 1, wherein said poly silicon region and said STI region are adapted to be formed with the process flow for forming a standard semiconductor device while not perturbing the process flow.

6. The sub-1V BGR circuit of claim 1, wherein said poly silicon region and said STI region are adapted to be formed concurrently with the process flow for the formation of a standard semiconductor device while not perturbing the process flow.

7. The sub-1V BGR circuit of claim 1, wherein the resistance of said resistor is easier to control as compared to the resistance of a resistor within a conventional sub-1V BGR circuit.

* * * * *